United States Patent
Hirler

(10) Patent No.: US 8,138,581 B2
(45) Date of Patent: Mar. 20, 2012

(54) SEMICONDUCTOR DEVICE WITH CHANNEL STOP TRENCH AND METHOD

(75) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/887,268

(22) Filed: Sep. 21, 2010

(65) Prior Publication Data

US 2011/0006407 A1    Jan. 13, 2011

Related U.S. Application Data

(63) Continuation of application No. 12/241,701, filed on Sep. 30, 2008, now Pat. No. 7,816,229.

(51) Int. Cl.
*H01L 23/58* (2006.01)
(52) U.S. Cl. ........ 257/652; 257/398; 257/399; 257/400; 257/E29.016; 438/430; 438/206; 438/270; 438/589
(58) Field of Classification Search .................. 438/270, 438/430, 454; 257/398–400, 652, E21.551, 257/E29.016
See application file for complete search history.

(56) References Cited

U.S. PATENT DOCUMENTS

| 5,614,751 A | 3/1997 | Yilmaz et al. |
| 5,877,528 A | 3/1999 | So |

FOREIGN PATENT DOCUMENTS

DE    10343084    7/2006

*Primary Examiner* — Angel Roman
(74) *Attorney, Agent, or Firm* — Dicke, Billig & Czaja, PLLC

(57) ABSTRACT

A semiconductor device is provided which includes a semiconductor substrate having a first surface, an active area and a peripheral area. The semiconductor device further includes least one channel stop trench formed in the semiconductor substrate, wherein the channel stop trench extends from the first surface at least partially into the semiconductor substrate and is arranged between the active area and the peripheral area. At least one electrode is arranged in the channel stop trench. The semiconductor substrate includes at least a peripheral contact region, which is arranged in the peripheral area at the first surface of the semiconductor substrate. A conductive layer is provided and in electrical contact with the electrode arranged in the channel stop trench and in electrical contact with the peripheral contact region. The conductive layer is electrically connected to the semiconductor substrate merely in the peripheral area and electrically insulated from the semiconductor substrate in the active area.

32 Claims, 5 Drawing Sheets

SEMICONDUCTOR DEVICE WITH CHANNEL STOP TRENCH AND METHOD

CROSS REFERENCE TO RELATED APPLICATIONS

This Patent Application is a continuation of U.S. patent application Ser. No. 12/241,701, filed Sep. 30, 2008, which is incorporated by reference.

BACKGROUND

Power semiconductor devices and integrated circuits processed on a common semiconductor substrate or wafer are separated by sawing or laser cutting of the wafer. Commonly, no additional passivation is provided on the separation edge formed by sawing or laser cutting, and the separation edges are merely covered by the moulding used for forming the device housing. Along the formed separation edges, crystal distortion and unsaturated bonds may remain which can act as generation centres particularly when the semiconductor device is subjected to high temperatures, humidity and varying temperature conditions.

Under high reverse or blocking voltages applied to the semiconductor device, electron-hole pairs may be generated at the generation centres. In case of an n-channel power-FET with a positive voltage applied between drain and source, the electrons can freely drift from the weakly n-doped drift region to the highly n-doped drain region and the drain electrode. On the other hand, the holes may reach the p-doped body region and eventually causes a leakage current. Furthermore, electrical conductors or a humid moulding arranged next to a silicon-oxide interface, which is usually arranged at the principal surface and formed, for example, by field oxides, may cause generation of a hole-inversion channel between the separation edge and a body region, which is electrically connected to source, if the electrical conductors or the humid moulding have an electrical potential which is less than the electrical potential of drain or which is close to the electrical potential of source. Further, p-doped regions and metallic regions arranged close to the separation edges may also contribute to the hole current.

For terminating the semiconductor device at its periphery, field plates are commonly used which are arranged on, and insulated from, the semiconductor substrate. The field plates are connected to a body region and/or source region on high potential to suppress any channel formation in the termination region. Another approach uses channel stop trenches for suppressing the channel in the termination region of the semiconductor device.

For these and other reasons, there is a need for the present invention.

SUMMARY

According to an embodiment, a semiconductor device is provided which includes a semiconductor substrate having a first surface, an active area and a peripheral area. The semiconductor device further includes least one channel stop trench formed in the semiconductor substrate, wherein the channel stop trench extends from the first surface at least partially into the semiconductor substrate and is arranged between the active area and the peripheral area. At least one electrode is arranged in the channel stop trench. The semiconductor substrate includes at least a peripheral contact region, which is arranged in the peripheral area at the first surface of the semiconductor substrate. A conductive layer is provided and in electrical contact with the electrode arranged in the channel stop trench and in electrical contact with the peripheral contact region. The conductive layer is electrically connected to the semiconductor substrate merely in the peripheral area and electrically insulated from the semiconductor substrate in the active area.

According to another embodiment, a method for manufacturing a semiconductor device is provided. A semiconductor substrate having a first surface is provided and at least one channel stop trench, which extends from the first surface into the semiconductor substrate, is formed in the semiconductor substrate for separating an active area of the semiconductor device from a peripheral area of the semiconductor device. At least one electrode is formed in the channel stop trench, so that the electrode is electrically insulated from the active area. At least a peripheral contact region of the semiconductor substrate is formed in the peripheral area at the first surface of the semiconductor substrate. A conductive layer is formed in electrical contact with the electrode arranged in the channel stop trench and in electrical contact with the peripheral contact region, such that the conductive layer is electrically connected to the semiconductor substrate merely in the peripheral area and electrically insulated from the semiconductor substrate in the active area.

Further embodiments, modifications and improvements of the semiconductor device and the method will become more apparent from the following description and the appending claims.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
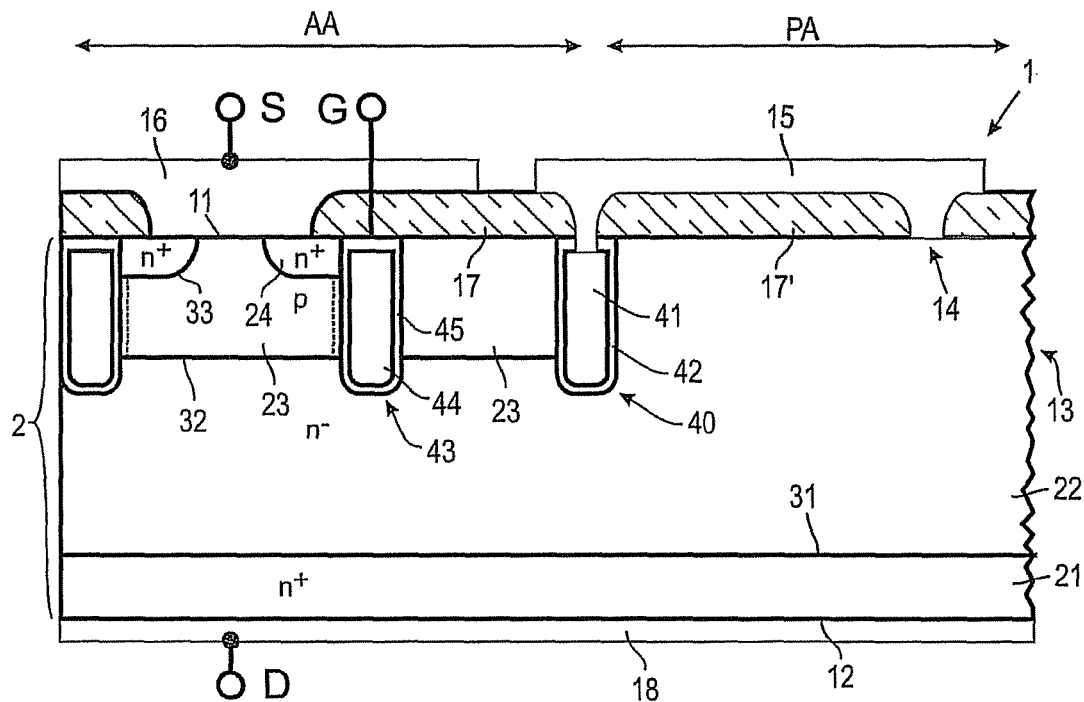
FIG. 1 illustrates an embodiment of a semiconductor device having a channel stop trench formed between an active area and a peripheral area of the semiconductor device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention.

Reference will now be made in detail to various embodiments, one or more examples of which are illustrated in the Figures. Each example is provided by way of explanation, and is not meant as a limitation of the appending claims. For example, features illustrated or described as part of one embodiment can be used on or in conjunction with other embodiments to yield yet a further embodiment. It is intended that the present description includes such modifications and variations. The examples are described using specific language which should not be construed as limiting the scope of the appending claims. The drawings are not scaled and are for illustrative purposes only.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or backside surface while a first surface is considered to be formed by the main surface, also referred to as upper or front surface, of the semiconductor substrate. The terms "above" and "below" as used in this specification therefore describe a location of a structural feature relative to another structural feature with consideration of this orientation.

Specific embodiments described in this specification and drawings pertain to, without being limited thereto, bipolar and unipolar power semiconductor devices and particularly to devices, which are controlled by field-effect such as FETs and IGBTs, as well as diodes.

In this specification, n-doped is referred to as first conductivity type while p-doped is referred to as second conductivity type. It goes without saying that the semiconductor devices can be formed with opposite doping relations so that the first conductivity type can be p-doped and the second conductivity type can be n-doped. Furthermore, the Figures of the drawings illustrate relative doping concentrations by indicating "−" or "+" next to the doping type. For example, "n−" means a doping concentration, which is less than the doping concentration of an "n"-doping region while an "n+"-doping region has a larger doping concentration than the "n"-doping region. Indicating the relative doping concentration does not, however, necessarily mean that doping regions of the same relative doping concentration have the same absolute doping concentration unless otherwise stated. For example, two different n+ regions can have different absolute doping concentrations. The same applies, for example, to an n+ and a p+ region.

With reference to FIG. 1, a first embodiment of a semiconductor device is described. The semiconductor device 1 includes a semiconductor substrate 2 having a first surface 11 and a second surface 12 arranged opposite to the first surface 11. The semiconductor substrate or body 2 can be made of any semiconductor material suitable for manufacturing a semiconductor device. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

The semiconductor substrate 2 can be a single bulk mono-crystalline material. It is also possible, that the semiconductor substrate 2 includes a bulk mono-crystalline material and at least one epitaxial layer formed thereon. Using epitaxial layers provides more freedom in tailoring the background doping of the material since the doping concentration can be adjusted during deposition of the epitaxial layer or layers.

The semiconductor substrate 2 further includes a drift region 22 of the first conductivity type. Drift region 22 is a weakly n-doped region. In contact with drift region 22, a drain region 21 of the second conductivity type is arranged. In this embodiment, drain region 21 is highly n-doped and forms a first junction 31, that is to say an nn+ junction in this embodiment, with n− doped drift region 22. In other embodiments, a field stop region of the first conductivity type having a higher doping concentration than the drift region 22 and a lower doping concentration than the drain region 21 is formed between the drift region 22 and the drain region 21. In some embodiments, the drift region 22 can have a doping concentration in a range from about $10^{13}/cm^3$ to about $10^{17}/cm^3$. In further embodiments, the drain region 21 can have a doping concentration in a range from about $10^{18}/cm^3$ to about $10^{21}/cm^3$.

At least one channel stop trench 40 is arranged in the semiconductor substrate 2. The channel stop trench 40 extends from the first surface 11 substantially vertically in the semiconductor substrate 2 and separates, at least at and adjacent to the first surface 11, an active area AA of the semiconductor device 1 from a peripheral area PA of the semiconductor device 1. The peripheral area PA is defined here to be the region of the semiconductor substrate 2, which extends, in a lateral direction, from the channel stop trench 40 to a substrate edge 13. A skilled person will appreciate that the peripheral area PA typically completely surrounds the active area AA, or a plurality of active areas, when seen in a plan view on the first surface 11 of the semiconductor substrate 2. The peripheral area PA terminates the active structures of the semiconductor device 1 at its periphery.

Substrate edge 13 is formed by sawing, laser cutting or any other suitable separating process during a separation process to separate semiconductor device 1 from other devices, which were commonly processed with semiconductor device 1 on a common wafer substrate. Substrate edge 13 therefore may exhibit crystal defects caused by the separation process as well as dangling bonds.

A p-doped body region 23 is formed on and in contact with the drift region 22. Thereby a second junction 32, that is to say a pn-junction in this embodiment, is formed. In some embodiments, the body region 23 can have a typical doping concentration in a range from about $10^{15}/cm^3$ to about $10^{19}/cm^3$. As illustrated in FIG. 1, at least one highly n-doped source region 24 is embedded in the body region 23. In some embodiments, source region or regions 24 can have a doping concentration in a range from about $10^{17}/cm^3$ to about $10^{20}/cm^3$. A third junction 33, that is to say a pn-junction in this embodiment, is formed between the source regions 24 and the body region 23. In this embodiment, body region 23 and source region or regions 24 are only formed in the active area AA and not in the peripheral area PA. Body region 23 extends in this embodiment within the active area AA to the channel stop trench 40.

In this embodiment, the channel stop trench 40 includes at least one electrode 41, which is referred to as channel stop electrode. In other embodiments the channel stop trench 40 includes at least two channel stop electrodes 41. In further embodiments the channel stop trench 40 includes at least three channel stop electrodes 41. In some embodiments the semiconductor substrate 2 includes at least two channel stop trenches 40, which are arranged, for example, around the active area AA as an inner ring structure and an outer ring structure. Each of the two channel stop trenches 40, or at least one of them, includes a channel stop electrode 41. The two channel stop trenches 40 can also include one or more channel stop electrodes 41 wherein one of them can include, for example, one channel stop electrode 41 and the other two channel stop electrodes 41 or a channel stop electrode 41 and a field electrode. The particular arrangement of the channel stop trench or trenches 40 and their channel stop electrodes 41 can be selected according to specific needs.

In this embodiment, the channel stop electrode 41 is insulated from the surrounding semiconductor substrate 2 by a thin insulating layer 42. As it become apparent from the description further below, the thin insulating layer 42 may also form a gate dielectric or a gate insulating layer of a field effect structure in the active area AA. The insulating layer 42 may be composed of regions with different thicknesses.

At least a peripheral contact region 14 of the semiconductor substrate 2 is arranged in the peripheral area PA at the first surface 11 of the semiconductor substrate 2. In this embodiment, the peripheral contact region 14 is formed by a portion of the drift region 22, which extends in the peripheral area PA to the first surface 11 of the semiconductor substrate 2. In other embodiments, an additional doping region, which has the same conductivity as, and a higher doping concentration of, the drift region 21, can be formed for reducing the contact resistance to the peripheral contact region 14. For example, the additional doping region can be formed together with source regions in the active area AA. In some embodiments, a plurality of peripheral contact regions 14 is arranged in the peripheral area PA. As illustrated in further embodiments below, body regions 23 having peripheral contact regions 14 can also be formed in the peripheral area PA.

A conductive layer 15 is arranged for example on or at the first surface 11 of the semiconductor substrate 2. Conductive layer 15 can also be arranged, at least partially, in trenches. Conductive layer 15 is in electrical contact with the channel stop electrode 41 of the channel stop trench 40 and furthermore in electrical contact with the peripheral contact region 14. At least one insulation region 17, 17' is arranged between the conductive layer 15 and semiconductor substrate 1. The insulation region 17, 17' includes openings to allow an electrical contact of the conductive layer 15 with the channel stop electrode 41 and the peripheral contact region 14. The connection between the conductive layer 15 and the peripheral contact region 14 provides a good electrical contact to the semiconductor substrate 2 in the peripheral area PA, i.e., to the drift region 22 in this embodiment. In embodiments, peripheral contact region 14 assumes a portion of the first surface 11 and forms a 2-dimensional contact, which has a reduced contact resistance. The contact resistance can be further reduced by increasing the area assumed by the peripheral contact region 14. For example, in other embodiments, insulation region 17' arranged on the first surface 11 in the peripheral area PA can be omitted to provide a large-area or 2-dimensional peripheral contact region 14. On the other hand, the conductive layer 15 is electrically insulated from the semiconductor substrate 2 in the active area AA. This avoids that a short is provided between the peripheral area PA and the active area AA as described below.

Insulation region 17, 17' can be made of, for example, oxides or other insulating materials. For example, insulation region 17, 17' can be thermally grown on the first surface 11 of the semiconductor substrate 2 either selectively or globally. In the latter case, the thus formed oxide layer is subsequently structured. In some embodiments, insulation region 17, 17' is formed by a field oxide.

In this embodiment, channel stop electrode 41 is electrically connected merely to the peripheral area PA through conductive layer 15 and electrically insulated from the active area AA. An electrical path is therefore provided from the channel stop electrode 41 to the drain region 21 through conductive layer 15 and drift region 22 of the peripheral area PA. The electrical potential applied to the drain region 21 is thus also applied to the channel stop electrode 41. A skilled person will recognize that the electrical potential of the channel stop electrode 41 might deviate from the electrical potential applied to drain region 21 due to the resistance of the drift region 22 and possible contact resistances.

In high voltage devices, the channel stop electrode 41 stops the extension of a space-charge region formed along the second junction 32. Terminating the space-charge region reduces the electric field in the peripheral area PA, particularly close to the substrate edge 13. Electron-hole pairs, which might be formed at crystal defects or unsaturated bonds of the semiconductor substrate, therefore do not experience strong electric fields and are not separated and eventually recombine. The formation of an observable leakage current is therefore reduced. For low voltage devices, the space-charge region does not necessarily reach channel stop trench 40. However, for all voltage classes, channel stop trench 40 typically discontinues any hole current between active area AA and peripheral area PA by discontinuing the body region 23 or any other region of second conductivity type (p-type in the present embodiment) and suppressing any second conductivity type channel formation (p-channel in this embodiment) between active area AA and peripheral area PA. For this purpose, the electrical potential of channel stop electrode 41 should be as close as possible to the highest electrical potential in the device which is typically the drain potential. Furthermore, the conductive layer 15 and the channel stop electrode 41 are electrically insulated from the active area AA.

The electrical insulation of the conductive layer 15 from the semiconductor substrate 2 in the active area AA furthermore prevents a leakage current. Even in the case that a remarkable electric field would occur in the peripheral area PA and generated electron-hole pairs be separated, the leakage current does not reach the active area AA since no electrical connection between the peripheral area PA and the active area AA is provided at or on the first surface 11.

In some embodiments, the semiconductor substrate 2 can be formed by providing a single bulk mono-crystalline body on which one or more single-crystalline layers are deposited epitaxially. The epitaxial layer or layers accommodate the drift region 22, body region 23 and source region or regions 24. During epitaxial deposition, the desired doping concentration of the drift region 22 is adjusted by supplying an appropriate amount of dopant. In other embodiments, the body region 23 and the source region or regions 24 can be formed in the epitaxially deposited layer by implantation. In further embodiments, the body region 23 can be formed during epitaxial deposition by appropriately providing dopants of the second conductivity type in the desired concentration. The source region 24 can also be formed as a substantially continuous layer by implantation or during epitaxial deposition. If desired, the manufacturing can include separate epitaxial deposition processes with different dopants of varying concentration or with the same dopant but with varying concentration to form the respective functional regions. In some embodiments, the final doping concentration of the drift region 22 can vary to include doping profiles having at least one minimum or at least one maximum or having a increasing or decreasing doping concentration from the drain region 21 to the body region 23.

In other embodiments, a substrate wafer having the desired background doping concentration of the drift region 22 is provided. Body region 23 and source region 24 are formed by implantation at the first surface 11. If desired, the substrate wafer can be thinned at the second surface 12 and drain region 21 is formed by implantation at the second surface 12. It would also possible to thin the substrate wafer before implanting source and body regions only if such thinned substrate wafers can reasonably handled. By using any of these approaches, an expensive epitaxial deposition is avoided.

In the embodiment illustrated in FIG. 1, body region 23 and source region or regions 24 are only formed in the active area AA. Furthermore, a portion of the drift region 22, which is referred to as active drift region, is also arranged in the active area AA. The portion of the drift region 22, which extends in the peripheral area PA, is referred to as peripheral drift region. Body region 23 is arranged between the source region 24 and the drift region 21, particularly between the source region 24 and the active drift region.

At least one gate trench 43, typically a plurality of gate trenches, is formed in the semiconductor substrate 2 in the active area AA. Gate trench 43 may extend through body region 23 and eventually reaches drift region 22. The gate trench 43 includes a gate electrode 44 which is insulated from the surrounding semiconductor substrate 2 by a gate insulating layer 45. In some embodiments, gate trench 43 has the same arrangement as channel stop trench 40 since both can be formed by common processes. For example, gate insulating layer 45 and insulating layer 42 of channel stop trench 40 can be commonly formed. Furthermore, gate electrode 44 and channel stop electrode 41 can also be commonly formed. In other embodiments, gate trench 43 has a different arrangement than channel stop trench 40, and both trenches 40, 43 are only partially processed by common processes. For example, gate trench 43 may include a field electrode which is arranged in the lower portion of the trench below, and insulated from, the gate electrode 44. In many embodiments, gate electrode 44 and channel stop electrode 41 are made of highly doped polysilicon or any other suitable polycrystalline semiconductor material as well as metals. Gate insulating layer 45 and insulating layer 42 can be an oxide layer, such as a thermally grown oxide layer. In case of silicon as material of the semiconductor substrate 2, gate insulating layer 45 and insulating layer 42 can be made of silicon oxide. In other embodiments, gate insulating layer 45 and insulating layer 42 are made of an oxide-nitride-oxide layer stack. In further embodiments, different materials are used for the gate insulating layer 45 and the insulating layer 42.

The semiconductor device 1 further includes a first metallization 16, which is in electrical contact at least with source region 24 and forms in this embodiment a source metallization. In this embodiment, source metallization 16 also contacts body region 23 to pin its electrical potential to source potential. In other embodiments, body region 23 is not in direct electrical contact with the source metallization 16 and thus floating. Source metallization 16 is electrically insulated from the peripheral area PA and not in electrical contact with the conductive layer 15.

Conductive layer 15 and source metallization 16 (first metallization) can be, however, commonly processed by, for example, depositing a metal layer which is subsequently structured, for example by a masked etch process.

Gate electrode 44 is in electrical contact with a gate metallization, which is not illustrated in FIG. 1. Gate metallization provides an electrical connection between the gate electrode 44 and a gate terminal G. By applying an appropriate electrical potential to the gate terminal G, an inversion channel can be formed in an inversion channel region of the body region 23. The inversion channel region is indicated in FIG. 1 by dashed lines and runs adjacent to and along the gate trench or trenches 43. A formed inversion channel electrically connects source region 24 with drift region 22 and therefore provides an electrical path between source region 24 and drain region 21. In embodiments including lateral DMOS transistors or drain-up transistors, for example in integrated circuits, drain region 21 and second metallization 18 can also be arranged on the first surface 11. In this case, a region of the second conductivity (p-type) is formed at the second surface 12.

A second metallization 18 is formed at or on the second surface 12 of the semiconductor substrate 2 in electrical contact with the drain region 21. The second metallization 21 includes a terminal D, which is referred to as drain terminal in this embodiment.

The first and second metallizations 16, 18 and the conductive layer 15 can be made of, or can contain, any suitable electrically conductive material including, without being limited thereto, highly doped polysilicon, aluminium, aluminium alloy, copper, copper alloy, nickel alloys, metal compositions, metal alloys and multilayer metallizations including a barrier or contact layer such as a titanium nitride layer and a metal layer. In some embodiments, the first metallization 16 and the conductive layer 15 include an AlSiCu alloy while the second metallization 18 includes a nickel alloy for improving solderability of the second metallization 18. A skilled person will appreciate that respective highly doped contact regions can be formed in the body region 23 and source regions 24 to provide good ohmic contact to the first metallization 16. In other embodiments, plugs made of, for example, tungsten or highly doped polysilicon are formed in vias arranged in the insulation region 17, 17' to provide electrical contact to the respective regions. Highly doped drain region 21 typically forms a good ohmic contact with second metallization 18.

Figure 2:
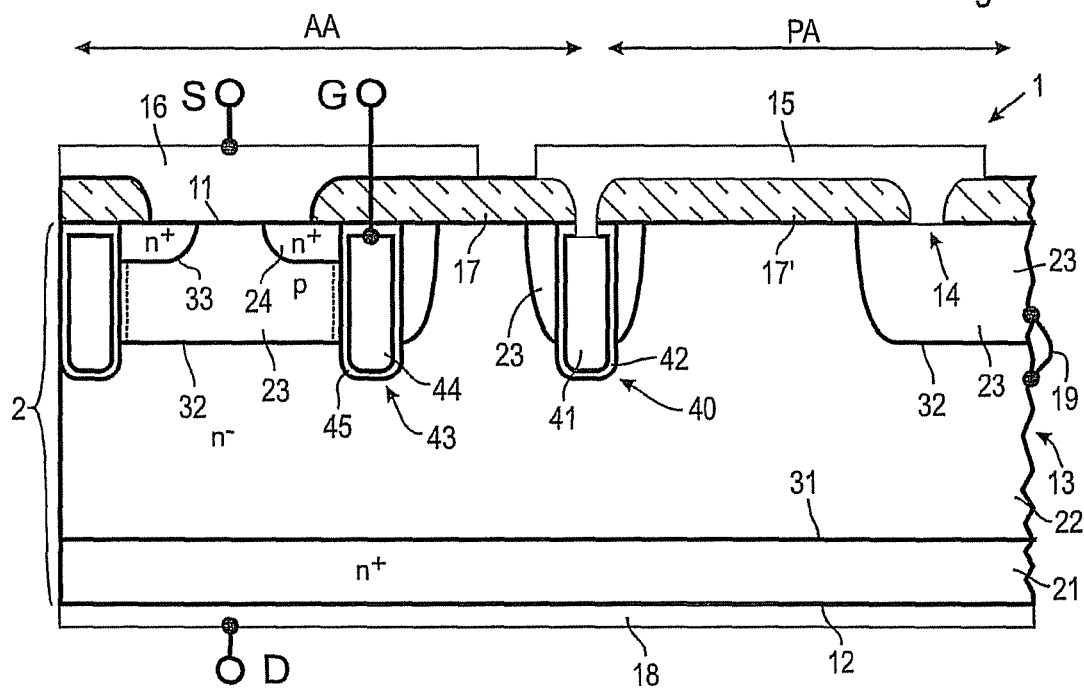
FIG. 2 illustrates an embodiment of a semiconductor device having a channel stop trench formed between an active area and a peripheral area of the semiconductor device, wherein a body region extends into the peripheral area.

FIG. 2 illustrates a further embodiment. Different to the embodiment of FIG. 1, a body region 23 of FIG. 2, which is formed at least partially at the first surface 11, extends to the substrate edge 13 so that a second junction 32, i.e., the pn-junction between drift region 22 and body region 23, also reaches to the substrate edge 13. In this embodiment, body regions 23 are formed after formation of field oxide regions not illustrated here. During implantation, no body regions 23 are formed underneath field oxide regions so that laterally structured body regions 23 are formed. The peripheral contact region 14 is thus formed by a portion of the body region 23 extending into the peripheral area PA. The body region 23 therefore also includes a peripheral body region arranged in the peripheral area PA. Peripheral body region is separated and electrically insulated from the active body region.

Second junction 32 between peripheral body region 23 and peripheral drift region 22 can be electrically shorted at substrate edge 13 via e.g., trap generation or hopping currents. Substrate edge 13 is formed by a separation process, which distorts the crystal lattice and causes an at least partially distorted pn-junction. The partially defective pn-junction 32 in peripheral area PA is therefore unable to provide a sufficient electrical barrier under reverse conditions since charge carriers can drift along crystal defects and pass the pn-junction 32. Hence, the disturbed pn-junction 32 in the peripheral area PA forms a conductive path 19, which carries leakage currents. The conductive path 19, which is substantially provided along the substrate edge 13 and runs between peripheral body region 23 and peripheral drift region 22, sufficiently electrically connects channel stop electrode 41 with drain region 21 through conductive layer 15. The substrate edge 13 is also a source of a trap generation current. The peripheral body region is suitable to collect the generated holes and is thereby set to a positive electrical potential close to the drain potential. In general, the peripheral body region 23 is arranged as close as possible to the substrate edge 13 to better collect holes. Peripheral body region 23 reaching the substrate edge 13 is even more effective. PN junction 32 in the active area AA is not affected by the separation process since it is insulated from the peripheral area by the channel stop trench 40. As described below, the distortion caused by the separation process cannot advance into the active area AA.

Figure 3:
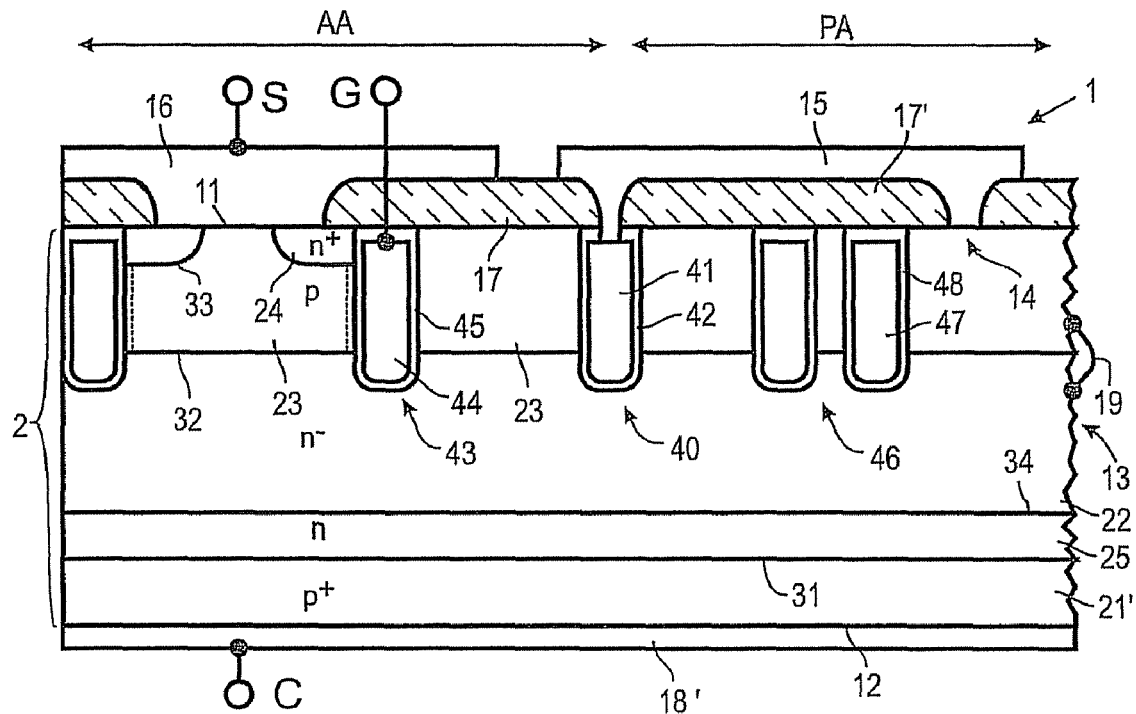
FIG. 3 illustrates an embodiment of a semiconductor device having a channel stop trench formed between an active area and a peripheral area of the semiconductor device, and a chipping stop trench formed in the peripheral area.

According to a further embodiment illustrated in FIG. 3, at least one chipping stop trench 46 is arranged in the peripheral area PA between the channel stop trench 40 and the peripheral contact region 14. The embodiment illustrated in FIG. 3 includes two chipping stop trenches 46. A skilled person will appreciate that the number of chipping stop trenches 46 is not limited to two but can include one, three or more. In some embodiments, chipping stop trench 46 has substantially the same arrangement as channel stop trench 40 and includes an electrode 47 and an insulating layer 48, which electrically insulates the electrode 47 from the surrounding semiconductor substrate 2. Different to the channel stop electrode 41, electrode 47 of chipping stop trench is not electrically connected to conductive layer 15 in this embodiment. Different to channel stop trench 40, electrode 47 of chipping stop trench 46 is electrically insulated from conductive layer 15 or does not have a direct electrical connection to conductive layer 15. As described below, electrical connection between electrode 47 of chipping stop trench 46 and conductive layer 15 is for example provided by transverse trenches.

The main purpose of chipping stop trench 46 is to keep breakage and cracks of the semiconductor substrate 2, which may occur during separation, restricted to the peripheral area PA. During separation, for example sawing, the brittle semiconductor substrate 2 may crack or break. The cracks could extend into the active area if not stopped by the chipping stop trench 46. Since the chipping stop trench 46 is typically filled with a polycrystalline material, the cracks cannot grow further and are stopped by the chipping trench stop 46. Particularly the electrode 47 is formed by polysilicon and the insulating layer 48 by silicon oxide, and this prevents that cracks can advance into the active area AA. The separation may result in a chipping of the semiconductor substrate 2 forming a typically scalloped substrate edge 13.

While the embodiments of FIGS. 1 and 2 pertain to unipolar power semiconductor devices such as power FETs, the embodiment of FIG. 3 pertains to a bipolar power semiconductor device, particularly to IGBTs and diodes. Therefore, an emitter region 21' of the second conductivity type, in this case a highly p-doped region, is formed at the second surface 12. The first junction 31 is formed here between the emitter region 21' and an optional field stop region 25 of the first conductivity type having a doping concentration higher than the doping concentration of the drift region 22. A fourth junction 34, in this case an nn$^+$junction, is formed between field stop region 25 and drift region 22. Emitter region 21' is electrically contacted by the second metallization 18, which includes a collector terminal C.

Chipping stop trench 46 also prevents cracks from affecting the channel stop trench 40. On the other hand, the cracks formed in the semiconductor substrate 2 and the chipping of the semiconductor substrate 2 increase the distortions extending over the pn-junction 32 in the peripheral area PA at substrate edge 13 and hence reduce the electrical resistance of the pn-junction formed between the peripheral body region 23 and the peripheral drift region 22. The conductivity of the conductive path 19 formed by the substrate edge 13 thus increases.

Figure 4:
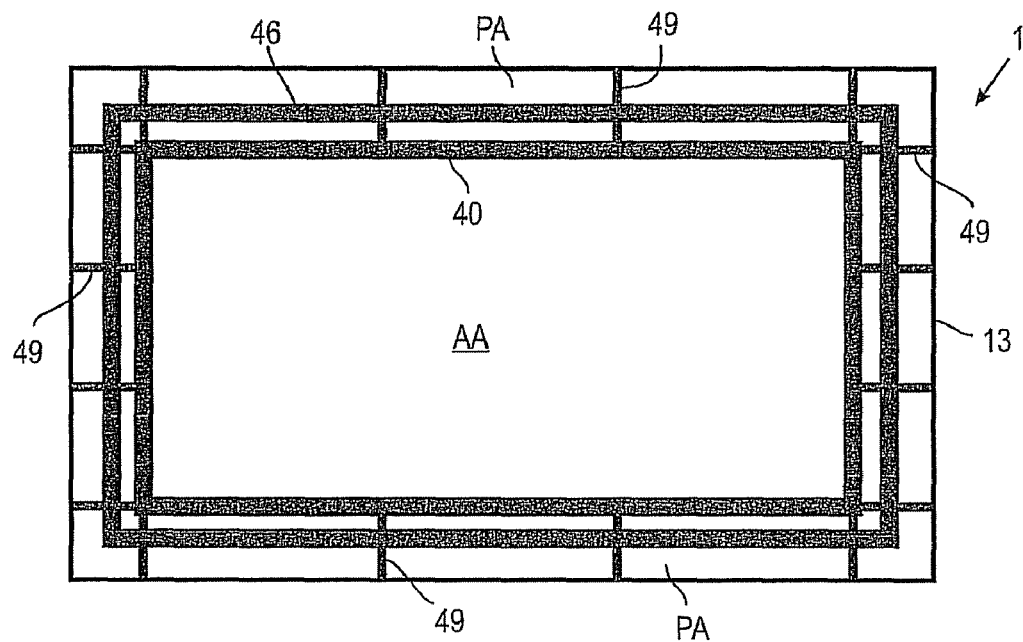
FIG. 4 illustrates, in a plan view, an embodiment of a semiconductor device having a channel stop trench, a chipping stop trench and multiple transverse trenches which connect the channel stop trench with the chipping stop trench and extend to the separation edge or substrate edge of the semiconductor substrate.

FIG. 4 illustrates a plan view on the first surface 11 of a semiconductor device 1 according to a further embodiment. As illustrated in FIG. 4, the active area AA is completely surrounded by the peripheral area PA. Active area AA is delimited from peripheral area PA by a circumferentially running channel stop trench 40. In some embodiments, at least two circumferentially running channel stop trenches 40 are formed. A chipping stop trench 46 runs in the peripheral area PA and completely surrounds the channel stop trench 40. In this embodiment, only one chipping stop trench 46 is illustrated. It would also be possible to provide two, three or even more chipping stop trenches 46.

The channel stop trench 40 is connected to the chipping stop trench 46 by at least one transverse trench 49. The transverse trench 49 extends from the channel stop trench 40 to chipping stop trench 46 and further to the substrate edge 13. The embodiment illustrated in FIG. 4 includes a plurality of transverse trenches 49, each of which extends to the substrate edge 13. The transverse trenches 49 can be formed together with the channel stop trench 40 and the chipping stop trench 46 and can therefore include an electrode, which is insulated from the semiconductor substrate 2 by an insulating layer. The channel stop electrode 41 may form together with the electrode 47 of the chipping stop trench 46 and the electrode of the transverse trenches 49 a common electrode structure. Since transverse trenches 49 extend to the substrate edge 13, this electrode structure is at least partially electrically connected to the semiconductor substrate 2 at the distorted substrate edge 13. Increasing the numbers of transverse trenches 49 extending to the substrate edge 13 improves the electrical connection between the electrode structure and the drift region 22 and or body region 23. In some embodiments, no additional conductive layer 15 and peripheral contact region 14 are therefore provided since the electrical connection provided through transverse trenches 49 at the substrate edge 13 is sufficient.

Thus, according to a further embodiment, a semiconductor device 1 is provided which includes a semiconductor substrate 2 having a first surface 11 and a substrate edge 13. At least one channel stop trench 40 is formed in the semiconductor substrate 2, wherein the channel stop trench 40 extends from the first surface 11 at least partially into the semiconductor substrate 2 and separates an active area AA of the semiconductor device 1 from a peripheral area PA of the semiconductor device 1. The peripheral area PA is arranged between the channel stop trench 40 and the substrate edge 13. At least one electrode 41 is arranged in the channel stop trench 40 and electrically insulated from the active area AA. At least one chipping stop trench 46 is formed in the semiconductor substrate 2 and arranged in the peripheral area PA between the channel stop trench 40 and the substrate edge 13. The channel stop trench 40 is connected to the chipping stop trench 46 by at least one transverse trench 49, which extends from the channel stop trench 40 to the substrate edge 13 and which provides an electrical connection between electrode 41 arranged in the channel stop trench 40 and the semiconductor substrate 2 of the peripheral area PA. Transverse trench 49 is therefore also subjected to a separation process for separating the semiconductor substrate 2. Cutting the transverse trench 49 improves its electrical connection to the semiconductor substrate 2. Eventually occurring chipping of the semiconductor substrate 2 during separation also improves the electrical connection. Channel stop trench 40 is not affected by the chipping since it is protected by chipping stop trench 46.

In some of the embodiments as described herein, the transverse trench 49 has a depth which is greater than the vertical extension of body region 23, i.e., the transverse trench 49 penetrates body region 23 and reaches as far as the drift region 22. This allows shortening of the pn-junction formed between drift and body region in the peripheral area PA at the substrate edge 13. In certain embodiments, the insulating layer of the transverse trench 49 is partially or completely removed so that the electrode material arranged in the transverse trench 49 is in electrical contact to the surrounding semiconductor substrate 2. This further improves the electrical connection between the channel stop electrode 41 and drain region 21 or emitter region 21'.

To describe embodiments in different terms, a semiconductor device 1 is provided having a semiconductor substrate 2 and at least one circumferentially running channel stop trench 40. The channel stop trench 40 includes at least one electrode 41 which is electrically connected merely to a peripheral area PA of the semiconductor device 1. Peripheral area PA is separated from an active area AA by the channel stop trench 40. The electrical connection between the electrode 41 and the semiconductor substrate 2 in the peripheral area PA is either provided by an electrical connection to at least one of a drift region 22, a body region 23, a source region 24, and a combination of these regions, wherein the drift region 22, body region 23 and source region 24 are arranged in the active area AA and at least partially in the peripheral area PA. In some embodiments, the body region 23 extends to a substrate edge 13 of the semiconductor substrate 2. In further embodiments, at least one chipping stop trench 46 is provided in the peripheral area PA between the channel stop trench 40 and the substrate edge 13. Chipping stop trench 46 may be arranged in spaced-relation to channel stop trench 40. To provide an electrical connection between the electrode 41 of the channel stop trench 40 and the semiconductor substrate 2 in the peripheral area PA, a conductive connection 15 is provided in some embodiments. The conductive connection 15, which can be for example a conductive layer, is formed in some embodiments on a surface of the semiconductor substrate 2 and in contact with a 2-dimensional peripheral contact region 14 formed at, and assuming a portion of, the surface of the semiconductor substrate 2 in the peripheral area PA. The peripheral contact region 14 can be formed in spaced relation to substrate edge 13 so that any distortions occurring at the substrate edge 13 does not affect the electrical connection between the conductive connection 15 and the peripheral contact region 14. In other embodiments, peripheral contact region 14 extends to the substrate edge 13.

According to a further embodiment, a semiconductor device 1 is provided which includes a semiconductor substrate 2 with a substrate edge 13, at least one channel stop trench 40 and at least one chipping stop trench 46. The channel stop trench 46 is arranged between the channel stop trench 40 and the substrate edge 13. A peripheral body region 23 is arranged between the chipping stop trench 46 and the substrate edge 13. The chipping stop trench 40 includes an electrode 41 which is electrically connected to the body region 23 arranged between the chipping stop trench 46 and the substrate edge 13.

The embodiments described above pertain to n-channel power-FETs and IGBTs and diodes. A skilled person will appreciate that the devices can also be of opposite channel-type, i.e., p-channel devices.

The embodiments described herein also include integrated circuits having trench gates. Such integrated circuits include a peripheral area PA which surrounds an active area AA wherein a channel stop trench 40 having an electrode 41 is arranged between the active area AA and the peripheral area PA or between active areas AA of two adjacent integrated devices.

In some embodiments, the walls of channel stop trench 40 can be lined partially or completely with a field oxide. In further embodiments, the channel stop trench 40 may include one, two or more electrodes, which are electrically insulated from each other. The electrodes can be pinned, either dynamically or statically, to a given electrical potential.

In connection with FIGS. 5A to 5F, a method for manufacturing a semiconductor device according to an embodiment will be described.

A semiconductor substrate 2 is provided which includes a first surface 11 and a second surface 12. The material of the semiconductor substrate 2 can be one of the materials mentioned above. In many embodiments, the semiconductor substrate 2 includes Si or SiC. Furthermore, the semiconductor substrate 2 can be manufactured as described above. In this embodiment, the semiconductor substrate 2 includes a weakly n-doped drift region 22 and a highly n-doped drain region 21 forming a first junction 31 with drift region 22. Drain region 21 is formed on the second surface 12, for example by implantation. In other embodiments, drain region 21 is formed at a later stage, for example shortly before forming a second metallization on the second surface 2. In case of an IGBT, a p-doped emitter region 21' is formed instead of the drain region 21. An optional n-doped field stop region 25 can also be formed either between the drain region 21 and the drift region 22 or between the emitter region 21' and the drift region 22.

Semiconductor substrate 2 includes an active area AA, a peripheral area PA and a substrate edge region 13' along which the semiconductor substrate will be cut in a later process. A skilled person will appreciate that the semiconductor substrate 2 is for example a semiconductor wafer in which a plurality of semiconductor devices 1 are commonly processed and which will be finally separated from each other by a separation process. The peripheral area PA of each semiconductor device 1 surrounds the respective active area AA. Substrate edge regions 13' are arranged between peripheral areas PA of adjacent semiconductor devices 1. In some embodiments, substrate edge regions 13' are arranged between chipping stop trenches of adjacent semiconductor devices 1, which chipping stop trenches will be formed in a later process as described below.

Figure 5A:
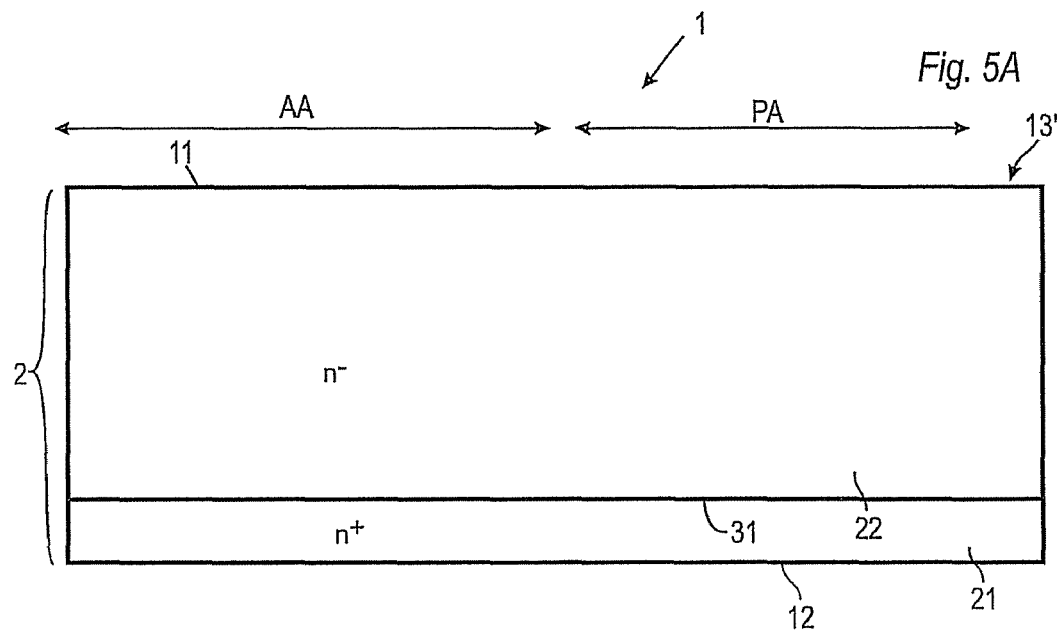
FIGS. 5A to 5F illustrate a method for manufacturing a semiconductor device according to an embodiment.
Figure 5B:
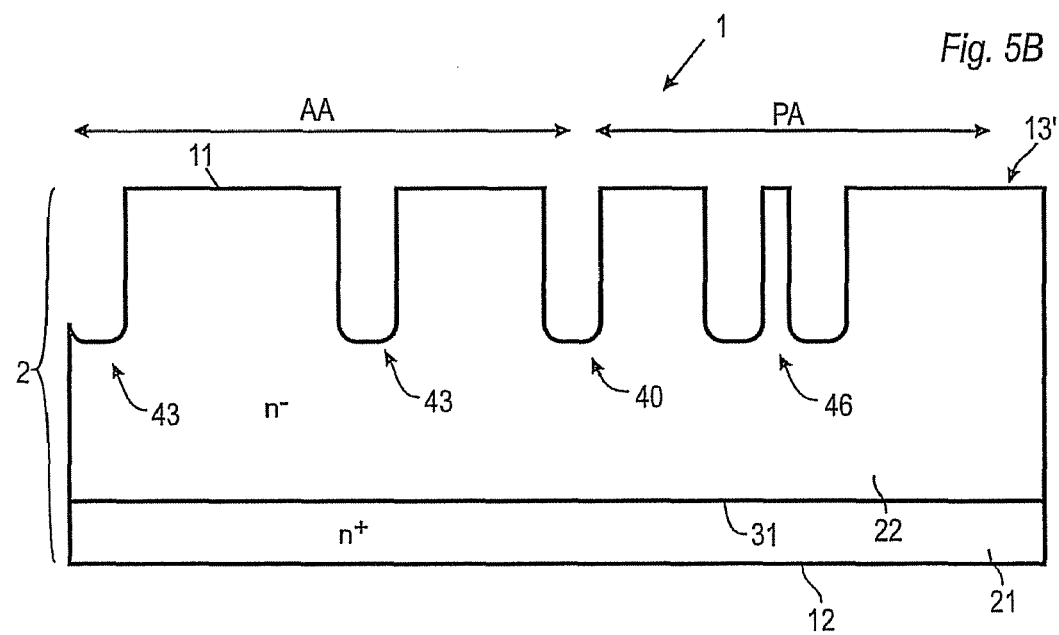

As illustrated in FIG. 5B at least one channel stop trench 40 is formed in the semiconductor substrate 2. Channel stop trench 40 extends from the first surface 11 into the semiconductor substrate 2 to a predetermined depth which is larger than the vertical location of a pn-junction between the drift region 22 and a body region which is later formed. In other embodiments, body region 23 is formed prior to trench formation. Channel stop trench 40 separates the active area AA from the peripheral area PA. Typically, channel stop trench 40 completely surrounds the active area AA.

To reduce manufacturing processes, channel stop trench 40 is formed together with gate trenches 43 arranged in the active area AA and optional chipping stop trenches 46 arranged in the peripheral area PA. Typically a plurality of gate trenches 43 are formed in the active area AA, each of which defining a cell of the power device 1. In some embodiments as described above, optional transverse trenches 49 are also formed together with channel stop trench 40.

In some embodiments, channel stop trench 40 is formed by an anisotropic etching process using a suitable mask which is not illustrated here. A field oxide is formed in many embodiments prior to or after trench formation. The field oxide can be thicker than the gate insulating layer and can mask the body and source implantation.

Subsequently, at least one channel stop electrode 41 is formed in the channel stop trench 40. The channel stop electrode 41 is electrically insulated from the surrounding semiconductor substrate 2, and particularly from the active area AA, by an insulating layer 42. To this end, the insulating layer 42 is formed, for example by thermal oxidation of the semiconductor substrate 2. In some embodiments, the thermal oxidation will also result in the formation of gate insulating layer 45 in the gate trenches 43 and insulating layer 47 in the chipping stop trench or trenches 46. Insulating layer 42 can be formed to be thicker at the bottom or at the bottom and lower portion of the side walls of the trenches compared to the channel forming portion. Thick regions of insulating layer 42 can include field oxide. Subsequently, the trenches are filled with a conductive material such as highly doped polysilicon. An eventually formed insulating layer on the first surface 11 and conductive material remained on the first surface 11 can be subsequently removed. Channel stop electrode 41, gate electrodes 44 and electrode 47 of chipping stop trench 46 are thus formed. In many embodiments, electrode 47 of chipping stop trench 46 remains electrically insulated from other structures of the semiconductor device 1. In other embodiments, electrode 47 has an electrical connection to the channel stop electrode 41 via transverse trenches 49 as described above.

A portion of the semiconductor substrate 2 in the peripheral area PA between the chipping stop trench 46 and the substrate edge region 13' forms a peripheral contact region 14 at the first surface 11. The location and size of the peripheral contact region 14 is for example defined by an insulation region 17, 17' which will be subsequently formed.

Figure 5C:
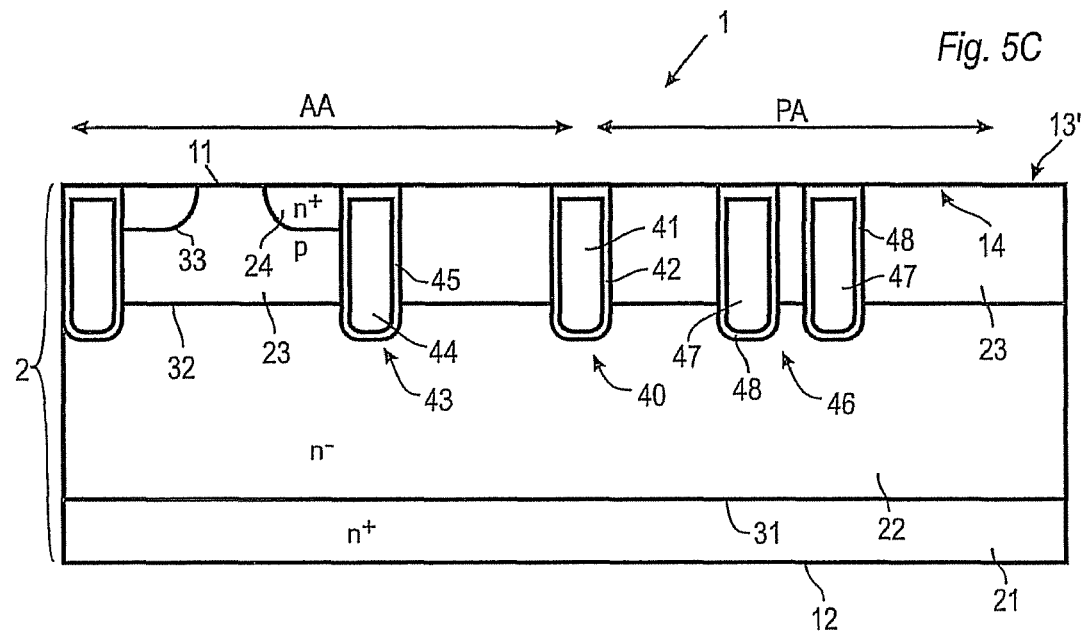

As illustrated in FIG. 5C, a p-doped body region 23 is formed in the semiconductor substrate 2, for example by implantation and diffusion. In this embodiment, body region 23 is formed such that it extends to the substrate edge region 13'. In other embodiments, body region 23 extends from the active area AA merely to the chipping stop trench 46 or merely to the channel stop trench 40 so that the drift region 22 reaches up to the first surface 11 in the peripheral area PA, particularly in the region where the peripheral contact region 14 is formed. Depending on the lateral extension of body region 23, peripheral contact region 14 is either formed in the body region 23 or drift region 22. Body region 23 forms together with drift region 22 a second junction 32, which is in this embodiment a pn-junction.

Highly, n-doped source regions 24 are formed in the active area AA adjacent to the gate trenches 43. If drift region 22 reaches up to the first surface 11, n-doped contact regions can also be formed in the region which will later form the peripheral contact region 14 to reduce the contact resistance. A third junction 33, in this case a further pn-junction, is formed between source regions 24 and body region 23. Body contact regions can be formed to lower the contact resistance to body regions 23 in active are AA and peripheral area PA.

In a further process, a structured insulation region 17, 17' is formed on the first surface 11, for example by deposition, or selective or local oxidation, or by global oxidation, and subsequent structuring. Structured insulation region 17, 17' defines the location and size of the peripheral contact region 14. Furthermore, insulation region 17, 17' may include vias for allowing contact to the body region 23 and the source regions 24 in the active area AA and for providing a contact to the channel stop electrode 41 and gate electrodes 44. The vias may extend through an insulation portion formed in the upper portion of the respective trenches. Vias may also be formed in the insulation region 17, 17' to provide contact to the channel stop electrode 41.

Figure 5D:
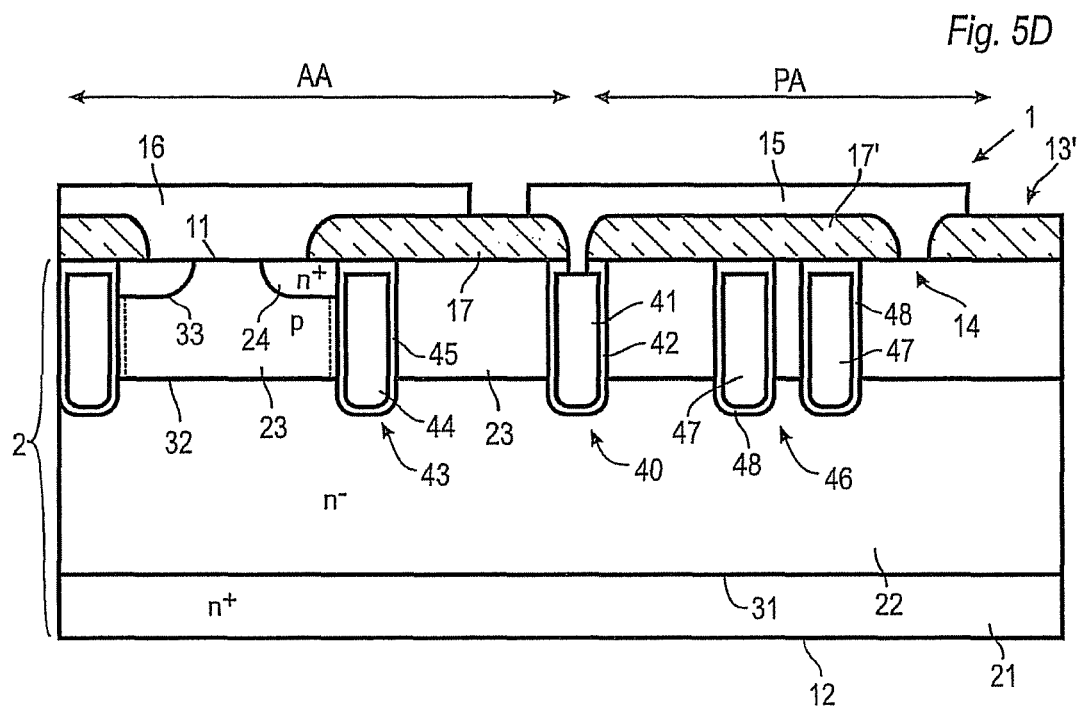

FIG. 5D illustrates that a conductive layer 15 is formed on the first surface 11, particularly on insulation region 17, 17' in the peripheral area PA to provide an electrical connection between channel stop electrode 41 and the peripheral contact region 14. Conductive layer 15 can be formed together with source metallization 16 by depositing a conductive material, which is subsequently structured, for example, by a masked etch process. Conductive layer 15 is electrically insulated from the active area AA and does not provide an electrical contact between channel stop electrode 41 and the semiconductor substrate 2 in the active area AA. Hence, no potential leakage current can flow from the peripheral area PA to the active area AA which improves reliability of the semiconductor device 1.

Figure 5E:
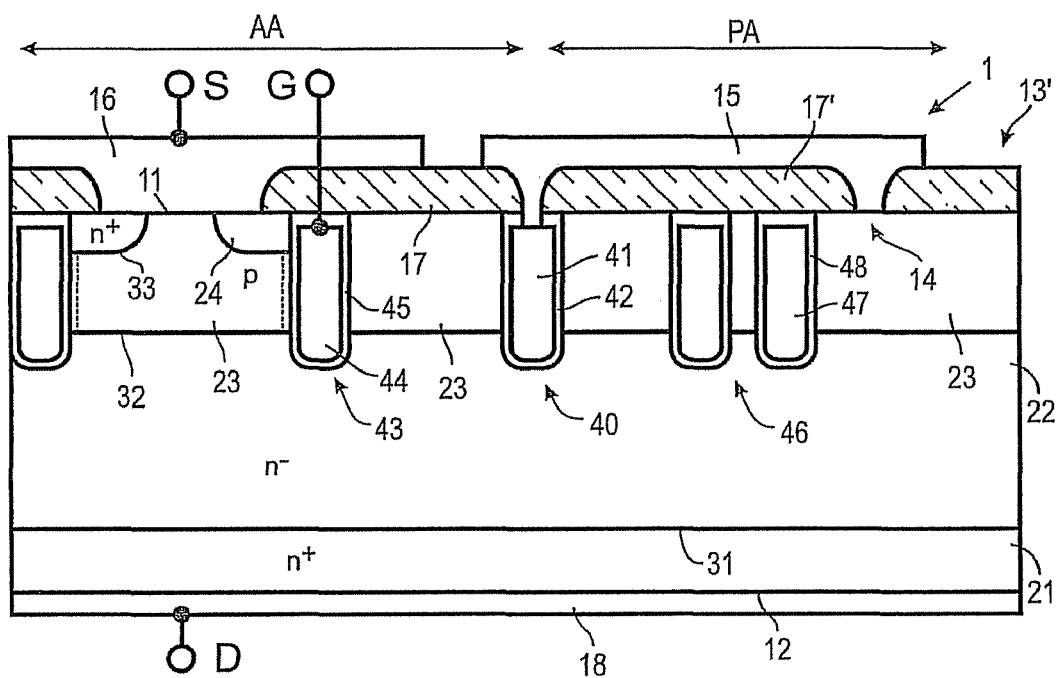

As illustrated in FIG. 5E drain metallization 18 is formed on the second surface 12 including a drain terminal D. In case of an IGBT, an emitter metallization 18' is formed on emitter region 21'. On the other hand, gate terminal G and source terminal S are formed on the first surface 11.

Conductive layer 15, source metallization 16, drain, emitter metallization 18 and gate, drain, collector and source terminals can be made of any of the above described materials.

Figure 5F:
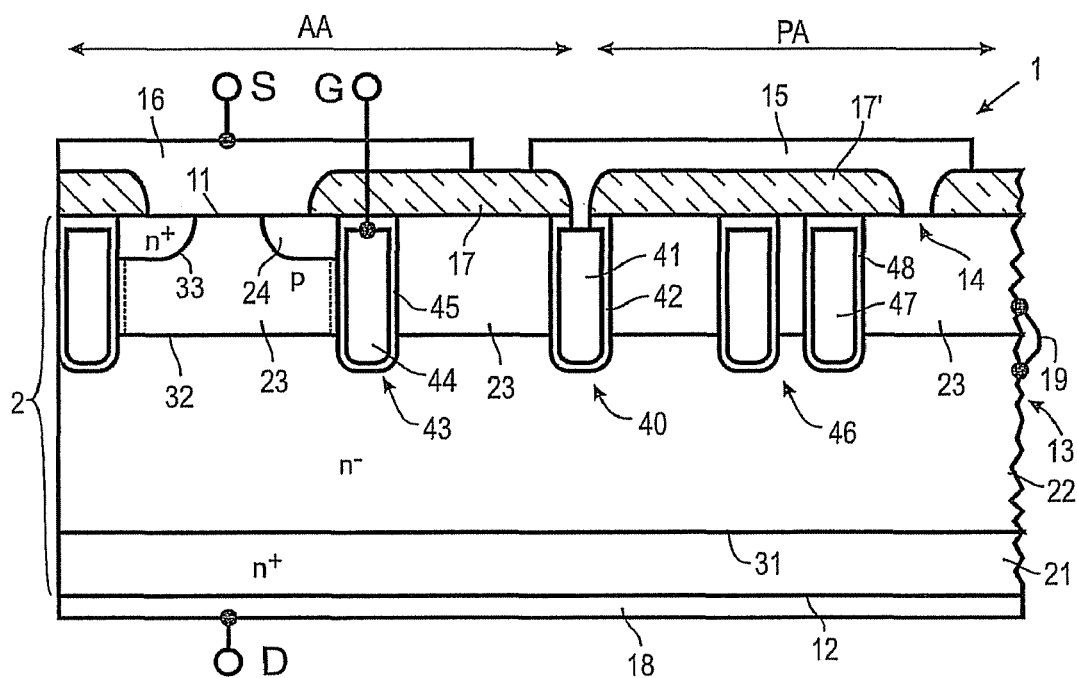

Finally, as illustrated in FIG. 5F, the commonly processed semiconductor devices 1 are separated from each other by a separation process which is e.g., selected from sawing, jet cutting and laser cutting. The semiconductor substrate 2 is separated along the substrate edge region 13' resulting in the formation of substrate edge 13. Due to the distortions caused by the separation process, pn-junction between peripheral body region 23 and peripheral drift region 22 is shorted by a conductive path 19 formed along the distorted substrate edge 13 or leakage currents.

According to a further embodiment, a method for manufacturing a semiconductor device is provided. The method includes providing a semiconductor substrate 2 having a first surface 11, an active area AA and a peripheral area PA. A substrate edge region 13' is defined and at least one channel stop trench 40 formed, which extends from the first surface 11 into the semiconductor substrate 2, for separating the active area AA of the semiconductor device 1 from the peripheral area PA of the semiconductor device 1. The peripheral area PA is arranged between the substrate edge region 13' and the active region AA. At least one channel stop electrode 41 is formed in the channel stop trench 40 and electrically insulated from the active area AA. At least a peripheral contact region 14 of the semiconductor device 1 is formed in the peripheral area PA at the first surface 11 of the semiconductor substrate 2. Furthermore, at least one chipping stop trench 46, which extends from the first surface 11 into the semiconductor substrate 2, is formed in the peripheral area PA between the channel stop trench 40 and the substrate edge region 13'. A conductive layer 15 is formed on a portion of the first surface 11 of the semiconductor substrate 2 in electrical contact with the channel stop electrode 41 and with the peripheral contact region 14 of the peripheral area PA such that the conductive layer 15 is electrically insulated from the semiconductor substrate 2 in the active region AA. The semiconductor substrate 2 is cut or separated along the substrate edge region 13'.

According to an embodiment, at least one transverse trench 49 is formed, which connects the chipping stop trench 46 with the channel stop trench 40 and which extends to the substrate edge region 13' of the semiconductor device 1. In some embodiments, electrodes are formed in the transverse trenches 49 and in the chipping stop trenches 46 so that a trench structure is formed which includes an electrode structure including the electrodes of the respective trenches.

Although specific embodiments have been illustrated and described herein, it will be appreciated by those of ordinary skill in the art that a variety of alternate and/or equivalent implementations may be substituted for the specific embodiments shown and described without departing from the scope of the present inventions. This application is intended to cover an adaptations or variations of the specific embodiments discussed herein. Therefore, it is intended that this invention be limited only by the claims and the equivalents thereof.

What is claimed is:

1. A semiconductor device, comprising:
   a semiconductor substrate including a first surface, an active area, a peripheral area, and a drift region of a first conductivity type extending in the peripheral area to the first surface;
   at least one channel stop trench formed in the semiconductor substrate, the channel stop trench extending from the first surface at least partially into the semiconductor substrate and being arranged between the active area and the peripheral area;
   at least one electrode arranged in the channel stop trench;
   a peripheral contact region of the semiconductor substrate arranged in the peripheral area at the first surface of the semiconductor substrate;
   at least one chipping stop trench formed in the semiconductor substrate, the chipping stop trench being arranged in the peripheral area between the channel stop trench and the peripheral contact region; and
   a conductive layer formed in electrical contact with the electrode arranged in the channel stop trench and in electrical contact with the peripheral contact region, wherein the conductive layer is electrically connected to the semiconductor substrate in the peripheral area and electrically insulated from the semiconductor substrate in the active area.

2. The semiconductor device of claim 1, wherein the peripheral contact region is formed in the drift region.

3. The semiconductor device of claim 1, wherein the semiconductor substrate includes a peripheral body region of a second conductivity type formed at least partially at the first surface, wherein the peripheral contact region is formed at least partially in the peripheral body region.

4. The semiconductor device of claim 3, wherein the semiconductor substrate further includes a substrate edge arranged on a side of the peripheral area opposite to the active area, wherein the body region extends at least partially to the substrate edge.

5. The semiconductor device of claim 1, wherein the channel stop trench includes an insulating layer arranged between the electrode arranged in the channel stop trench and the surrounding semiconductor substrate.

6. The semiconductor device of claim 1, wherein the channel stop trench surrounds, in a plan view on the first surface, the active area.

7. The semiconductor device of claim 1, wherein the active area includes at least a source region of a first conductivity type, a body region of a second conductivity type and a drift region of the first conductivity type, the body region being arranged between the source region and the drift region, the semiconductor device further including a first metallization which is in electrical contact at least with the source region and is electrically insulated from the peripheral area.

8. The semiconductor device of claim 7, wherein the active area further includes at least one gate trench formed in the semiconductor substrate, wherein the gate trench includes at least one gate electrode for generating an inversion channel in a channel region of the body region.

9. The semiconductor device of claim 1, further comprising at least one chipping stop trench formed in the semiconductor substrate, the chipping stop trench being arranged in the peripheral area between the channel stop trench and the peripheral contact region.

10. The semiconductor device of claim 9, wherein the chipping stop trench and the channel stop trench are connected to each other by at least one transverse trench.

11. The semiconductor device of claim 10, wherein the semiconductor substrate further includes a substrate edge arranged on a side of the peripheral area opposite to the active area, wherein the transverse trench extends to the substrate edge.

12. The semiconductor device of claim 1, further comprising at least one insulation region arranged between the conductive layer and the semiconductor substrate in the peripheral area.

13. The semiconductor device of claim 1, further comprising vias arranged in the insulation region to provide an electrical contact to the peripheral contact region and to the electrode arranged in the channel stop trench.

14. The semiconductor device of claim 13, further comprising an insulation portion formed in an upper portion of the channel stop trench, wherein a via extends through the insulation portion.

15. The semiconductor device of claim 1, wherein the conductive layer is at least partially arranged in trenches.

16. The semiconductor device of claim 1, wherein the peripheral contact region comprises a contact doping region.

17. The semiconductor device of claim 3, wherein the drift region extends to the first surface between the peripheral body region and the channel stop trench.

18. A semiconductor device, comprising:
   a semiconductor substrate including a first surface, a substrate edge, an active area and a peripheral area, and a drift region of a first conductivity type extending in the peripheral area to the first surface, the peripheral area being arranged between the substrate edge and the active area;

at least one channel stop trench formed in the semiconductor substrate, the channel stop trench extending from the first surface at least partially into the semiconductor substrate and separating the active area from the peripheral area;

at least one chipping stop trench formed in the semiconductor substrate, the chipping stop trench being arranged in the peripheral area;

at least one electrode arranged in the channel stop trench and electrically insulated from the active area;

at least one peripheral contact region of the semiconductor substrate arranged in the peripheral area and assuming at least a portion of the first surface of the semiconductor substrate; and a conductive layer formed at a portion of the first surface of the semiconductor substrate and providing an electrical connection between the electrode arranged in the channel stop trench and the peripheral contact region of the peripheral area of the semiconductor substrate, the conductive layer being electrically insulated from the active area.

19. The semiconductor device of claim 18, wherein the peripheral contact region is formed in the drift region.

20. The semiconductor device of claim 18, wherein the semiconductor substrate includes a peripheral body region of a second conductivity type formed at least partially at the first surface, wherein the peripheral body region is arranged in the peripheral area and extends at least partially to the substrate edge, wherein the peripheral contact region is formed in the body region.

21. The semiconductor device of claim 18, further comprising at least on chipping stop trench formed in the semiconductor substrate, the chipping stop trench being arranged in the peripheral area.

22. The semiconductor device of claim 21, wherein the chipping stop trench and the channel stop trench are connected to each other by at least one transverse trench which extends to the substrate edge.

23. A method for manufacturing a semiconductor device, comprising:
providing a semiconductor substrate including a first surface and a drift region of a first conductivity type extending in the peripheral area to the first surface;
forming at least one channel stop trench, which extends from the first surface into the semiconductor substrate, for separating an active area of the semiconductor device from a peripheral area of the semiconductor device;
forming at least one electrode in the channel stop trench, so that the electrode is electrically insulated from the active area;
forming at least a peripheral contact region of the semiconductor substrate in the peripheral area at the first surface of the semiconductor substrate; and
forming a conductive layer in electrical contact with the electrode arranged in the channel stop trench and in electrical contact with the peripheral contact regions, such that the conductor layer is electrically connected to the semiconductor substrate merely in the peripheral area and electrically insulated from the semiconductor substrate in the active area.

24. The method of claim 23, further comprising:
forming the peripheral contact region in the drift region.

25. The method of claim 23, further comprising:
forming a body region of a second conductivity type in the semiconductor substrate adjacent to the drift region; and forming the peripheral contact region in the body region.

26. The method of claim 25, further comprising:
forming a substrate edge region so that the peripheral area is arranged between the substrate edge region and the active area, wherein the body region is formed such that it extends at least partially to the substrate edge region.

27. The method of claim 26, further comprising:
cutting the semiconductor substrate along the substrate edge region.

28. The method of claim 23, further comprising:
forming at least one chipping stop trench in the semiconductor substrate in the peripheral area between the channel stop trench and the peripheral contact region.

29. A semiconductor device, comprising:
a semiconductor substrate including a first surface, an active area, a peripheral area, and a drift region of a first conductivity type extending in the peripheral area to the first surface;
at least one channel stop trench formed in the semiconductor substrate, the channel stop trench extending from the first surface at least partially into the semiconductor substrate and being arranged between the active area and the peripheral area;
at least one electrode arranged in the channel stop trench;
a peripheral contact region of the semiconductor substrate arranged in the peripheral area of the semiconductor substrate;
a conductive layer formed in electrical contact with the electrode arranged in the channel stop trench and in electrical contact with the peripheral contact region, wherein the conductive layer is electrically connected to the semiconductor substrate in the peripheral area and electrically insulated from the semiconductor substrate in the active area.

30. A semiconductor device, comprising:
a semiconductor substrate including a first surface, a substrate edge, an active area, a peripheral area, and a drift region of a first conductivity type extending in the peripheral area to the first surface, the peripheral area being arranged between the substrate edge and the active area;
at least one channel stop trench formed in the semiconductor substrate, the channel stop trench extending from the first surface at least partially into the semiconductor substrate and separating the active area from the peripheral area;
at least one electrode arranged in the channel stop trench and electrically insulated from the active area;
at least one peripheral contact region of the semiconductor substrate arranged in the peripheral area of the semiconductor substrate;
an insulation region arranged on the first surface of the semiconductor substrate, the insulation region comprising openings for allowing electrical contact to the peripheral contact region and to the electrode arranged in the channel stop trench; and
a conductive layer formed on the insulation region and providing an electrical connection between the electrode arranged in the channel stop trench and the peripheral contact region of the peripheral area of the semiconductor substrate, the conductive layer being electrically insulated from the active area.

31. A semiconductor device, comprising:
a semiconductor substrate comprising an active area, a peripheral area, at least one circumferentially running channel stop trench separating the peripheral area from the active area of the semiconductor substrate, and a drift region of a first conductivity type extending in the peripheral area to the first surface, the channel stop trench comprising at least one electrode; and an electrical connection between the electrode of the channel stop trench and at least one of a peripheral drift region and a peripheral body region, wherein the electrode of the channel stop trench is electrically insulated from the active area of the semiconductor substrate.

32. The semiconductor device of claim 31, further comprising:

a substrate edge, wherein the peripheral area is arranged between the substrate edge and the active area, and wherein the peripheral contact region is arranged in spaced relation to the substrate edge.

* * * * *